United States Patent
van der Kouwe

(10) Patent No.: US 7,432,706 B2
(45) Date of Patent: Oct. 7, 2008

(54) MAGNETIC RESONANCE IMAGING USING BLOOD FLOW NAVIGATION

(75) Inventor: Andre van der Kouwe, Woburn, MA (US)

(73) Assignee: The General Hospital Corporation, Boston, MA (US)

( * ) Notice: Subject to any disclaimer, the term of this patent is extended or adjusted under 35 U.S.C. 154(b) by 0 days.

(21) Appl. No.: 11/735,578

(22) Filed: Apr. 16, 2007

(65) Prior Publication Data

US 2007/0247150 A1    Oct. 25, 2007

Related U.S. Application Data

(60) Provisional application No. 60/745,168, filed on Apr. 19, 2006, provisional application No. 60/833,558, filed on Jul. 27, 2006.

(51) Int. Cl.
*G01V 3/00* (2006.01)
(52) U.S. Cl. .................................................. 324/306
(58) Field of Classification Search ......... 324/300–322; 600/410–435
See application file for complete search history.

(56) References Cited

U.S. PATENT DOCUMENTS

| | | | |
|---|---|---|---|
| 4,937,526 A | 6/1990 | Ehman et al. | |
| 5,539,312 A | 7/1996 | Fu et al. | |
| 5,603,322 A | 2/1997 | Jesmanowicz et al. | |
| 6,958,605 B2 | 10/2005 | Dale et al. | |
| 7,254,437 B2* | 8/2007 | Miyazaki | 600/410 |
| 2002/0188190 A1* | 12/2002 | Kassai et al. | 600/410 |
| 2004/0059213 A1* | 3/2004 | Kassai et al. | 600/410 |
| 2007/0265522 A1* | 11/2007 | Kassai et al. | 600/411 |

* cited by examiner

*Primary Examiner*—Diego Gutierrez
*Assistant Examiner*—Dixomara Vargas
(74) *Attorney, Agent, or Firm*—Quarles & Brady LLP

(57) ABSTRACT

An fMRI study is conducted using a 2D EPI pulse sequence. A separate blood flow navigator pulse sequence is interleaved with the fMRI data acquisition to monitor blood flow in arteries that feed the brain tissue. Information in the blood flow navigator data is used to reduce errors in the fMRI data due to tissue motion caused by pulsatile blood flow. In one embodiment the blood flow navigator information is used to gate the fMRI acquisition and in another embodiment the information is used to retrospectively correct acquired fMRI data.

12 Claims, 6 Drawing Sheets

MAGNETIC RESONANCE IMAGING USING BLOOD FLOW NAVIGATION

CROSS REFERENCE TO RELATED APPLICATIONS

This application is based on U.S. provisional patent application Ser. No. 60/745,168, filed Apr. 19, 2006 and entitled "System and Method for Medical Imaging Using Blood Flow Navigation" and U.S. provisional patent application Ser. No. 60/833,558, filed Jul. 27, 2006 and entitled "Magnetic Resonance Imaging Using Blood Flow Navigation" and claims the benefit thereof.

STATEMENT REGARDING FEDERALLY SPONSORED RESEARCH

This invention was made with government support under Grants No. NIBIB R21EB0250 and NCRR P41RR14075 awarded by the National Institutes of Health. The United States Government has certain rights in this invention.

BACKGROUND OF THE INVENTION

The field of the invention is magnetic resonance imaging (MRI) methods and systems. More particularly, the invention relates to the reduction of errors in NMR images caused by motion resulting from pulsatile blood flow.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the gyromagnetic constant $\gamma$ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The practical value of this phenomenon resides in the signal which is emitted by the excited spins after the excitation signal $B_1$ is terminated. There are a wide variety of measurement sequences in which this nuclear magnetic resonance ("NMR") phenomena is exploited.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

Object motion during the acquisition of NMR data produces both blurring and "ghosts" in the phase-encoded direction. Ghosts are particularly apparent when the motion is periodic, or nearly so. For most physiological motion, each view is acquired in a period short enough that the object may be considered stationary during the acquisition window. In such case the blurring and ghosting is due to the inconsistent appearance of the object from view to view. Motion that changes the appearance between views such as that produced by a patient moving, by a respiration or a cardiac cycle, or by peristalsis, is referred to hereinafter as "view-to-view motion". Motion may also change the amplitude and phase of the NMR signal as it evolves during the pulse sequence and such motion is referred to hereinafter as "in-view motion".

Both blurring and ghosting can be reduced if the data acquisition is synchronized with the functional cycle of the object to reduce view-to-view motion. This method is known as gated NMR scanning, and its objective is to acquire NMR data at the same point during successive functional cycles so that the object "looks" the same in each view. In the case of motion caused by the pumping action of the heart, it is common practice to acquire an ECG signal that indicates cardiac phase. This signal can be used to gate the acquisition of NMR data only during certain phases of the cardiac cycle.

Functional magnetic resonance imaging (fMRI) of the brain is performed by acquiring a time-series of images of one or more anatomic sections of interest. As described, for example, in U.S. Pat. No. 5,603,322, algorithms used to extract functional activity from an fMRI time-series are based on the assumption that signal intensity fluctuations in each voxel are dependent only on physiologic changes induced by a functional activation task of known timing. However, image-to-image global head motion invalidates this assumption. Motion occurring over the acquisition of the time-series of images can be conceptually divided into two categories: intra-image motion and inter-image motion. Intra-image motion refers to view-to-view motion which occurs during the period of time that the phase-encoded lines of data necessary to reconstruct a single image are being acquired. This motion can originate from i) respiratory expansion and contraction of the thorax, ii) cardiac-driven pulsatility of the brain, overlying vessels, and cerebral spinal fluid, and iii) bulk rotational and translational head motion. Intra-image motion results in image blurring and ghosting. However, for fMRI studies performed with a single-shot EPI acquisition in which all data for one image are collected in under 100 msec, intra-image (view-to-view) motion is not a major problem. Inter-image motion is defined as that occurring between acquisition of successive images in an fMRI time-series. Such inter-image motion usually arises from global head movement or tissue motion due to the pulsatile flow of blood as it is pumped into the brain by the heart.

It is common practice to acquire navigator signals during an fMRI scan to correct for inter-image motion caused by global head motion. Navigator pulse sequences such as those disclosed in U.S. Pat. Nos. 4,937,526, 5,539,312 and 6,958,605 are interleaved with the fMRI pulse sequences and the data they acquire is used to correct for global head motion.

SUMMARY OF THE INVENTION

The present invention is a method and system for reducing the errors caused by pulsating blood flowing into tissues being imaged with an MRI system. A blood flow navigator pulse sequence is interleaved with the MRI pulse sequence to acquire navigator data from a slice through a blood vessel supplying the pulsatile blood to the tissues. The acquired blood flow navigator data is used to gate the MRI pulse sequence, to retrospectively correct tissue data acquired with the MRI pulse sequence, or to prospectively correct the tissue data acquired with the MRI pulse sequence. The slice from which the blood flow navigator data is acquired is remote from the tissues being imaged and the navigator pulse sequence includes a magnetization maintenance sequence that excites spins in the tissues being imaged to maintain a steady-state magnetization therein.

An object of the invention is to reduce errors produced in fMRI data acquired from the brain of a subject caused by pulsatile flow of blood into the subject's head. The navigator pulse sequence acquires navigator data from a slice passing through one or more arteries that deliver blood to the brain. This navigator data is processed and used to gate the fMRI data acquisition or to correct the fMRI data.

DETAILED DESCRIPTION OF THE PREFERRED EMBODIMENT

Figure 1:
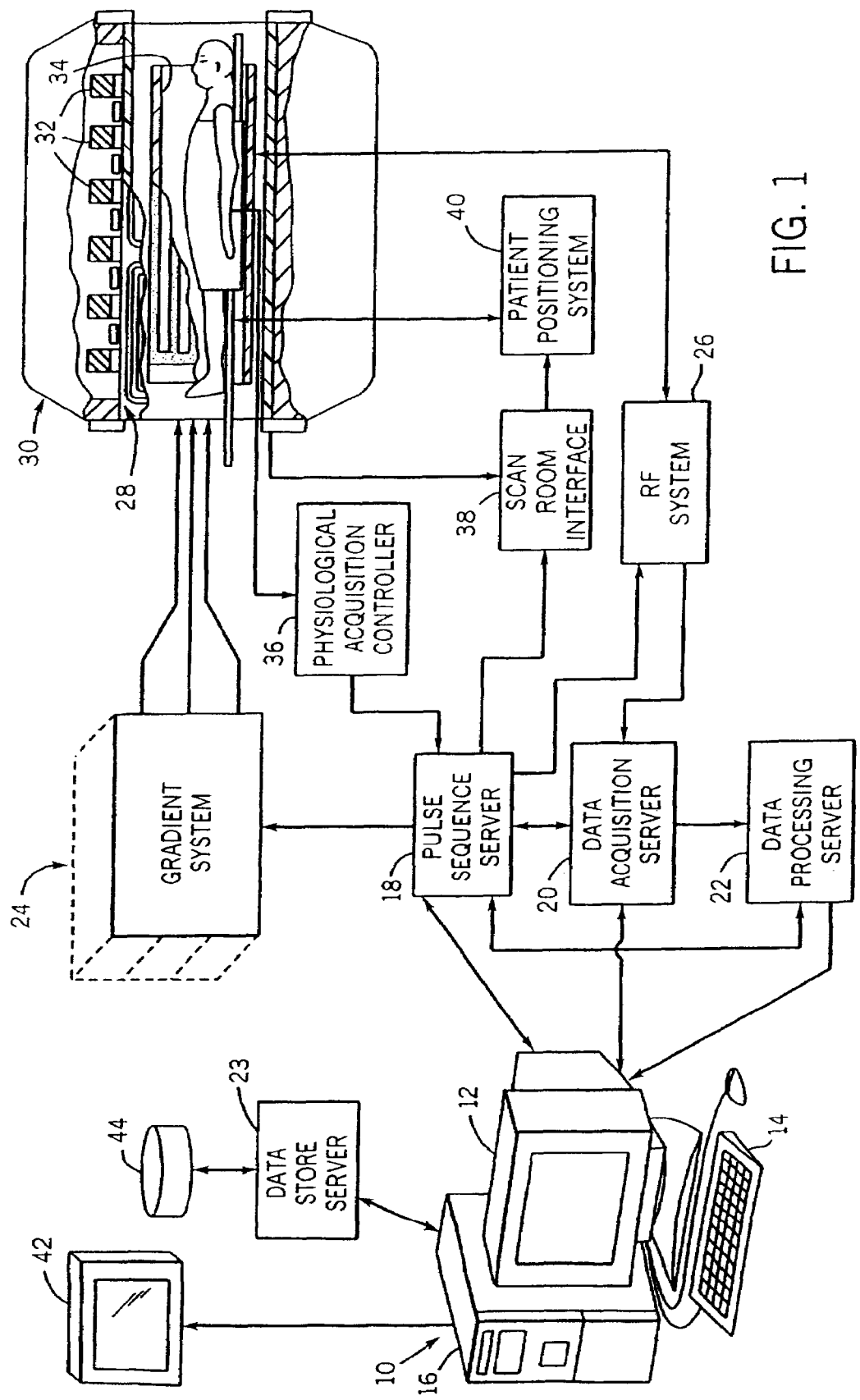
FIG. 1 is a block diagram of an MRI system which is employed to practice the present invention.

Referring particularly to FIG. 1, the preferred embodiment of the invention is employed in an MRI system. The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers: a pulse sequence server 18; a data acquisition server 20; a data processing server 22, and a data store server 23. In the preferred embodiment the data store server 23 is performed by the workstation processor 16 and associated disc drive interface circuitry. The server 18, is performed by a separate processor and the servers 20 and 22 are combined in a single computer. The workstation 10 and each processor for the servers 18, 20 and 22 are connected to an Ethernet communications network. This network conveys data that is downloaded to the servers 18, 20 and 22 from the workstation 10 and it conveys data that is communicated between the servers and between the workstation and the servers.

The pulse sequence server 18 functions in response to directions downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$ and $G_z$ used for position encoding NMR signals. The gradient coil assembly 28 forms part of a magnet assembly 30 which includes a polarizing magnet 32 and a whole-body RF coil 34.

RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays.

RF system 26 also includes one or more RF receiver channels. Each RF receiver channel includes an RF amplifier that amplifies the NMR signal received by the coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M=\sqrt{I^2+Q^2},$$

and the phase of the received NMR signal may also be determined:

$$\phi=\tan^{-1}Q/I.$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

The digitized NMR signal samples produced by the RF system 26 are received by the data acquisition server 20. The data acquisition server 20 receives the real-time NMR data and provides buffer storage such that no data is lost by data overrun. In some scans the data acquisition server 20 does little more than pass the acquired NMR data to the data processor server 22. However, in scans which require information derived from acquired NMR data to control the further performance of the scan, the data acquisition server 20 is programmed to produce such information and convey it to the pulse sequence server 18. For example, during prescans NMR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process NMR signals used to detect the arrival of contrast agent in an MRA scan. In all these examples the data acquisition server 20 acquires NMR data and processes it in real-time to produce information which is used to control the scan.

The data processing server 22 receives NMR data from the data acquisition server 20 and processes it. Such processing may include, for example: Fourier transformation of raw k-space NMR data to produce two or three-dimensional images; the application of filters to a reconstructed image; the performance of a backprojection image reconstruction of acquired NMR data; the calculation of functional MR images; the calculation of motion or flow images, etc.

Images reconstructed by the data processing server 22 are conveyed back to the workstation 10 where they are stored. Real-time images are stored in a data base memory cache (not shown) from which they may be output to operator display 12 or a display 42 which is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

To practice the present invention a local head coil is used in place of the whole body rf to receive the NMR signals produced in the brain. A local gradient coil and end-capped birdcage RF coil such as that disclosed in U.S. Pat. No. 5,372,137 may be employed and is incorporated herein by reference or a 12 channel matrix head coil commercially available from Siemens Corporation may be used.

Figure 2:
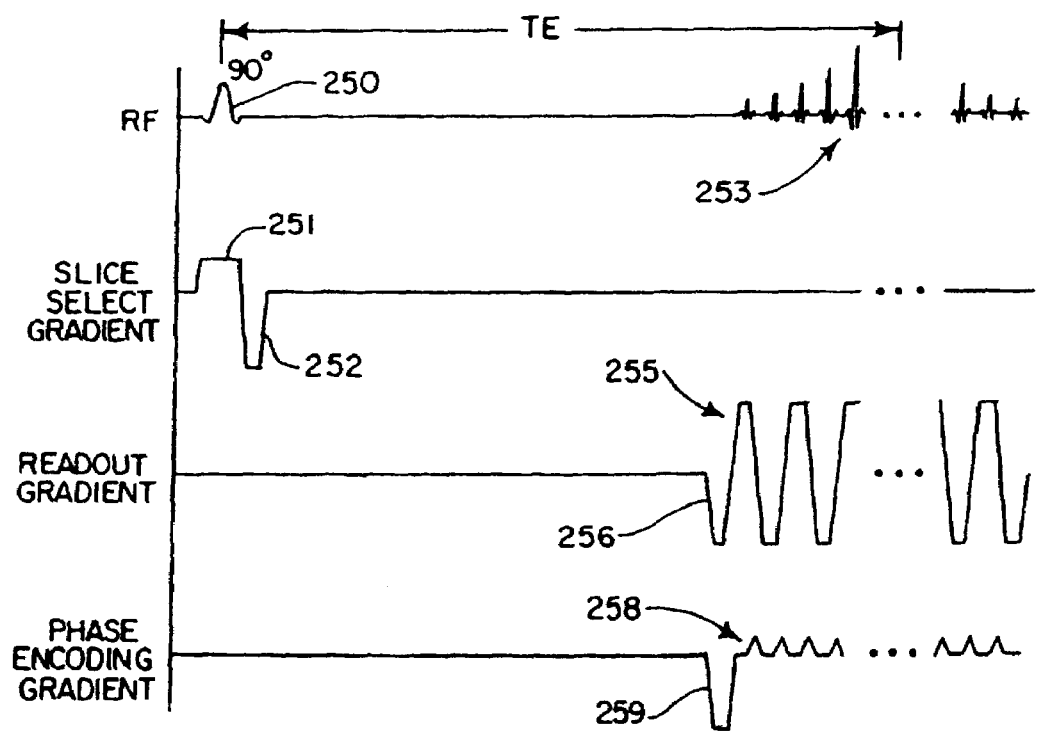
FIG. 2 is a graphic illustration of a pulse sequence which directs the MRI system of FIG. 1 to acquire functional MRI data.

An EPI pulse sequence is employed in the preferred embodiment of the invention to acquire fMRI data, or tissue data, from the subject's brain. Referring particularly to FIG. 2, a 90° RF excitation pulse 250 is applied in the presence of a $G_z$ slice select gradient pulse 251 to produce transverse magnetization in a slice through the brain ranging from less than 2 mm to 25 mm thick. The excited spins are rephased by a negative lobe 252 on the slice select gradient $G_z$ and then a time interval elapses before the readout sequence begins. A total of 64 separate NMR echo signals, indicated generally at 253, are acquired during the EPI pulse sequence. Each NMR echo signal 253 is a different view which is separately phase encoded to scan ky-space from ky=−32 to ky=+31 in monotonic order. The readout sequence is positioned such that the view acquired at ky=0 occurs at the desired echo time (TE). In the preferred embodiment an EPI pulse sequence with TE=40 ms and TR=200 ms (for 26 slices) is used. An in-plane resolution of 3.125×3.1256 mm², a field of view of 200 mm and a slice thickness of 4 mm are used.

The NMR echo signals 253 are gradient recalled echoes produced by the application of an oscillating $G_x$ readout gradient field 255. The readout sequence is started with a negative readout gradient lobe 256 and the echo signals 253 are produced as the readout gradient oscillates between positive and negative values. A total of 128 samples (64 samples, twice oversampled) are taken of each NMR echo signal 253 during each single positive or negative readout gradient pulse 255. The successive NMR echo signals 253 are separately phase encoded by a series of Gy phase encoding gradient pulses 258. The first pulse is a negative lobe 259 that occurs before the echo signals are acquired to encode the first view at ky=−32. Subsequent phase encoding pulses 258 occur as the readout gradient pulses 255 switch polarity, and they step the phase encoding monotonically upward through ky space.

At the completion of the EPI pulse sequence, therefore, 128 separate frequency encoded samples of 64 separately phase encoded NMR echo signals 253 have been acquired. The acquired NMR data is processed in the conventional manner to produce or reconstruct an NMR image. As explained above, a two dimensional Fourier transformation can be performed by the data processing server 22 (FIG. 1) and the resulting NMR image can be stored for further processing by the data store server 23. Thus, the 128×64 element array of complex numbers is Fourier transformed along both of its dimensions (ky and kx) to produce a 128×64 element array of image data that indicates a signal magnitude along each of its two dimensions (y and x). As part of this processing the extra field of view due to oversampling can be removed to yield a 64×64 pixel image.

Figure 3:
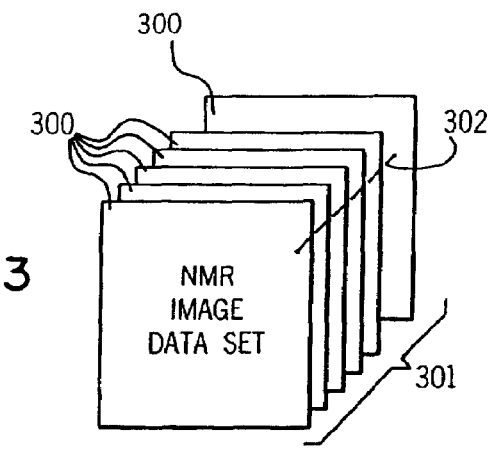
FIG. 3 is a pictorial representation of fMRI data acquired with the pulse sequence of FIG. 2.

Referring to FIG. 3, the 2D NMR images are organized as a set of 2D arrays 300 in which each element stores the magnitude of the NMR signal from one voxel in the scanned slice. Each array 300 can be used to directly produce a 256×256 pixel anatomical image of the brain slice for output to the video display 12. While each array 300 is a "snap shot" of the brain slice at a particular time during the time course study, the NMR image data set may also be viewed as a single 3D array 301 in which the third dimension is time.

The time course NMR data for one voxel in the array 301 is referred to as a time course voxel vector. One such vector is illustrated in FIG. 3 by the dashed line 302. Each time course voxel vector 302 indicates the magnitude of the NMR signal at a voxel in the image slice over the time course study. One such time course voxel vector indicates neuronal activity in one brain voxel during the study.

It should be apparent that the integrity of each voxel vector requires that the NMR signal in each of its elements be acquired from the same location in the subject's brain throughout the study. This is difficult to achieve due to patient motion and due to movement of brain tissue within the skull caused by pulsating blood flow. It is this latter problem which is the subject addressed by the present invention.

Figure 4:
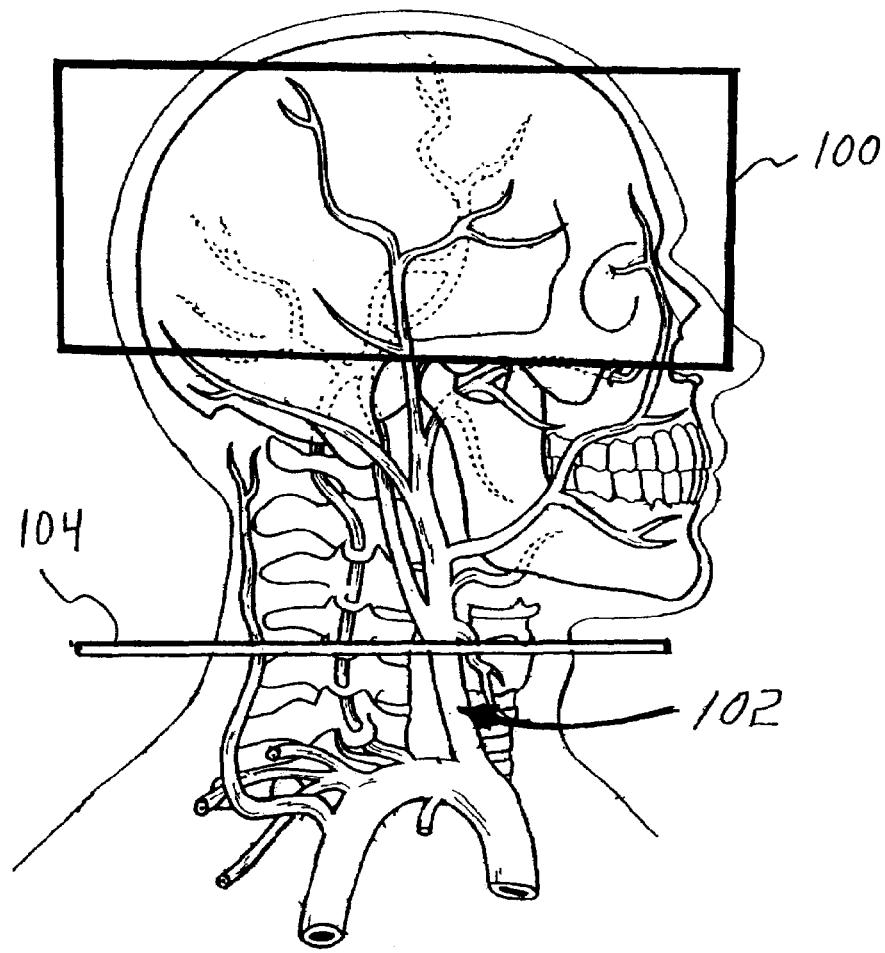
FIG. 4 is a pictorial representation of the head of a subject placed in the MRI system of FIG. 1.

Referring particularly to FIG. 4, fMRI data is acquired from a slab of tissue in the brain such as that indicated at 100. Using the above 2D EPI pulse sequence, data is acquired from slab 100 as a series of closely spaced 2D slices that span the vertical extent of the slab 100. It is contemplated, however, that a single 3D EPI pulse sequence may also be used to acquire fMRI data from the slab 100. Large arteries supply blood to these tissues being imaged, such as the carotid artery 102, and it is the pulsation of these arteries in synchronism with the subject's heart beat that moves the imaged tissues enough to present a problem.

In accordance with the present invention, navigator data is acquired from a 2D axial slice indicated at 104 that includes the arteries that deliver blood to the brain. This 2D slice 104 is completely separate from the slab 100 being imaged and the acquired navigator data is used to monitor the pulsatile blood flow into the brain. This navigator data may be used in a number of different ways to reduce the effect of tissue motion caused by pulsatile blood flow into the brain and flow artifacts caused by movement of blood in small vessels in the brain tissue. It may be used to produce a gating signal that determines when fMRI data is acquired during each heart cycle. It may also be acquired and used to prospectively correct for motion or it may be stored with the acquired fMRI data and used to correct such data retrospectively.

Figure 5:
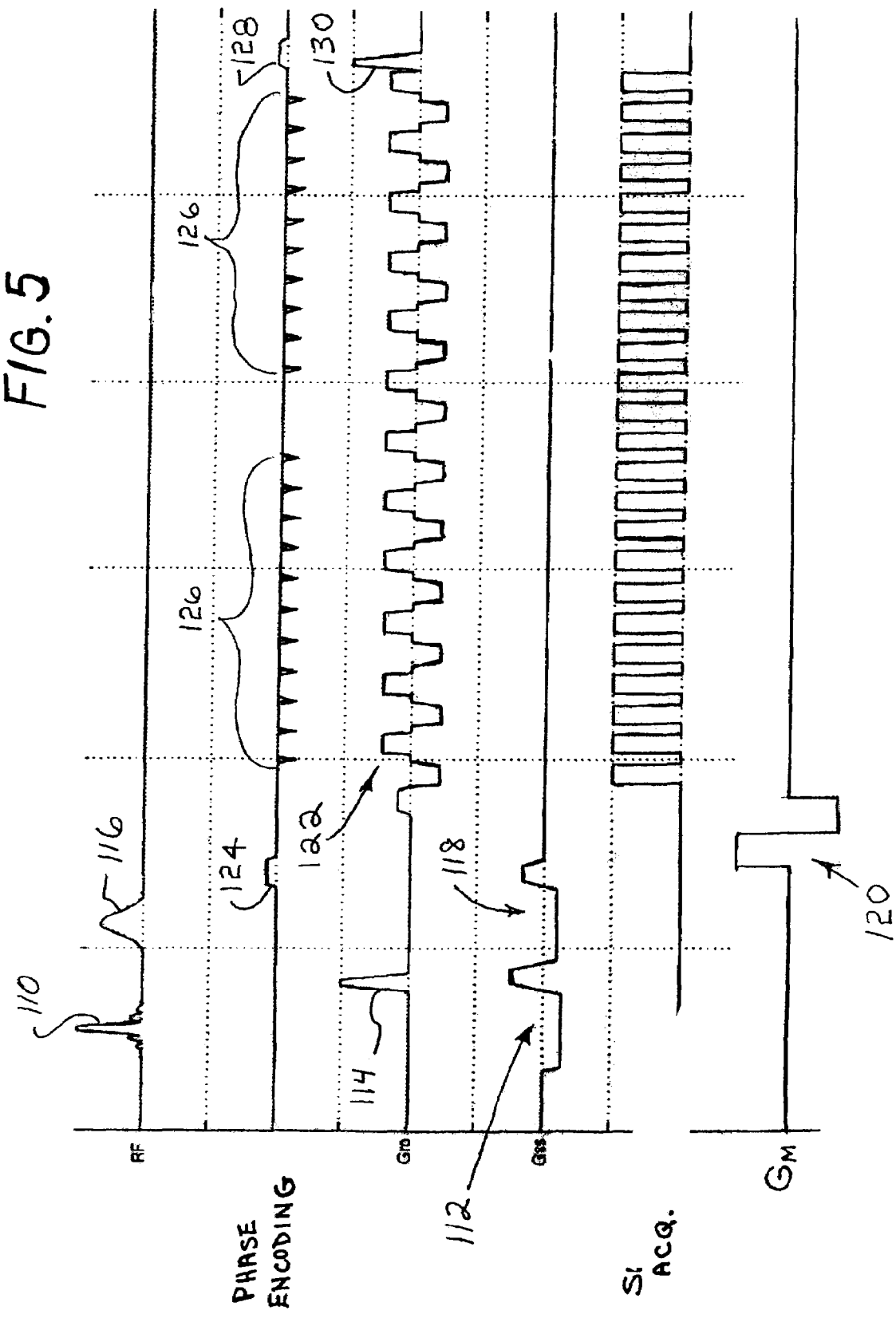
FIG. 5 is a graphic representation of a pulse sequence which directs the MRI system of FIG. 1 to acquire a blood flow navigator image.

The navigator pulse sequence used in the preferred embodiment is a modified 2D EPI pulse sequence. Referring to FIG. 5, this blood flow navigator pulse sequence includes a magnetization maintenance sequence comprised of a spatially selective RF excitation pulse 110, a slab select gradient pulse 112 and a spoiler gradient 114. The RF excitation pulse 110 and slab select gradient pulse 112 are designed to excite spins in the slab 100 and the flip angle of the RF excitation pulse 100 is selected to maintain a steady-state level of spin magnetization in the slab 100. In this preferred embodiment the flip angle is set to 90°. The spoiler gradient 114 dephases the transverse magnetization in the slab 100 that results. Thus, any time the scan of the imaging slab 100 is interrupted to acquire navigator data from the 2D slice 104, the steady-state magnetization level in the slab 100 is maintained.

Referring still to FIG. 5, following the magnetization maintenance section of the navigator pulse sequence, a selective RF excitation pulse 116 is produced in the presence of a slice-select gradient pulse 118. These pulses serve to excite spins in the 2D slice 104 located at the desired axial location on the subject's neck. The slice 104 should be located as high ("superior") as possible without interfering with the imaging slab 100. Almost any position lower ("inferior") to the pons works as there are large vessels passing through an axial plane below this level. Depending on the location of the slice 104 and the particular head coil used, the RF body coil 34 is used for excitation and either the body coil 34 or the head coil is used to receive the NMR signals from the slice 104.

Following this excitation, a bipolar velocity encoding gradient 120 is applied. This gradient 120 is directed along the direction of the blood flow to be monitored, and in the preferred embodiment this is the axial direction produced by the slice-select gradient $G_{ss}$. The first moment $M_1$ of the velocity encoding gradient 120 is chosen to provide maximum sensitivity to the blood flow being monitored without producing phase wrap at the highest velocities.

The k-space data is then acquired from the 2D slice 104 in the manner of an EPI scan. A Cartesian, or rectilinear, sampling pattern is performed by acquiring one line of k-space data during each of a series of readout gradient pulses 122. The sampling is started at one edge of k-space by a pre-phase encoding pulse 124 and successive lines are then acquired in monotonic order by applying phase encoding "blips" 126 between readout gradient pulses 122. However, when the center of k-space is reached, three acquisitions are acquired before acquiring the other half of k-space. These three acquisitions at the center of k-space are averaged to form a high SNR phase navigator signal for N/2 ghost correction. At the completion of the pulse sequence the magnetization is rephased by a rewinder gradient pulse 128 and any remaining transverse magnetization is dephased by a spoiler gradient pulse 130. In the preferred embodiment the blood flow navigator pulse sequence acquires a 12 by 64 matrix of k-space samples at a slice thickness of 10 mm and an FOV of 150 mm by 150 mm.

The blood flow navigator data can be used in a number of different ways during an MRI scan. In the first embodiment to be described with reference to FIG. 6, the blood flow navigator data is used to produce a gating signal during an fMRI scan. This is particularly useful when fMRI data is acquired from a slab 100 located at the brainstem where motion artifacts and or artifacts due to pulsatile blood flow is significant.

Figure 6:
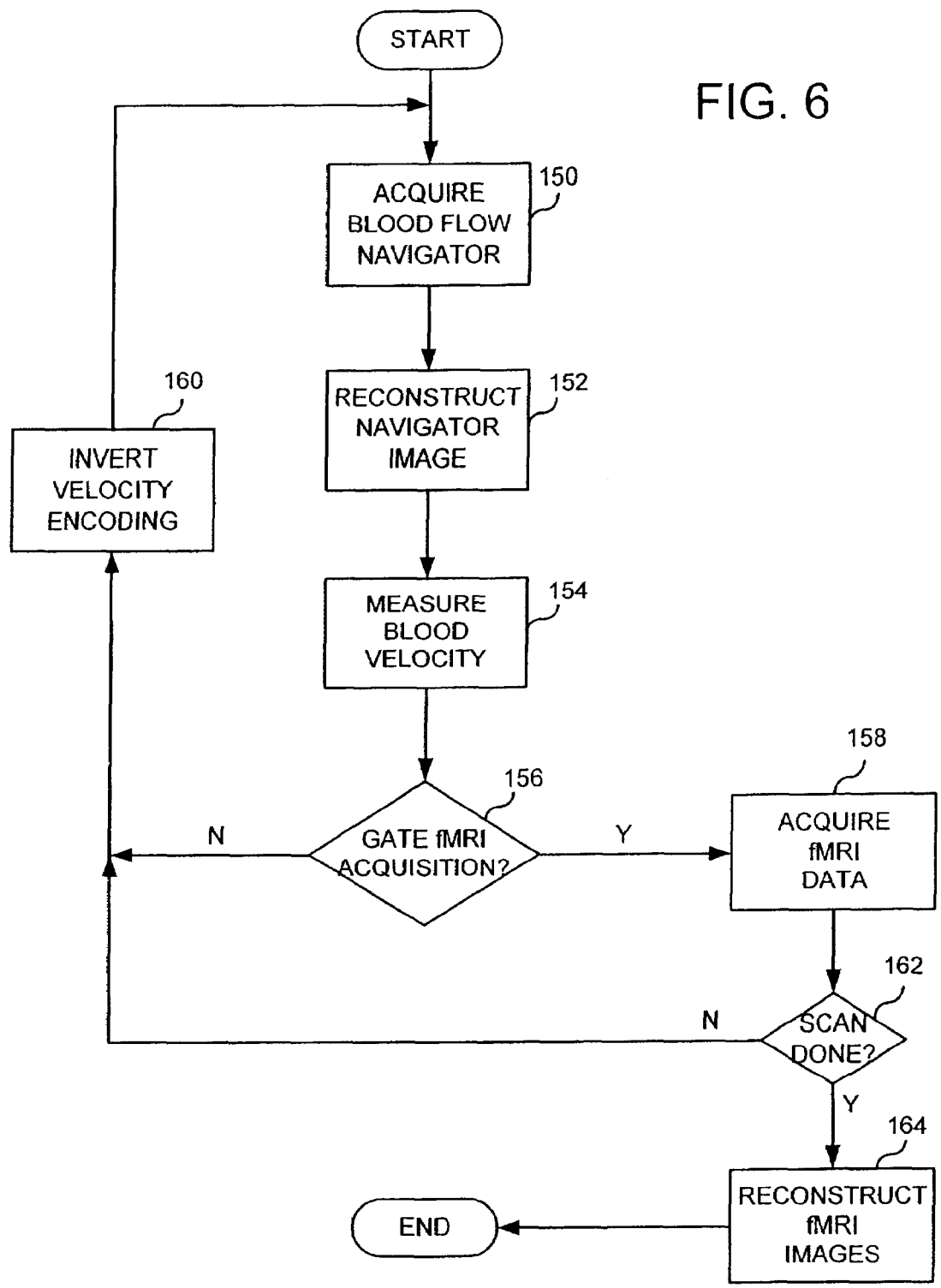
FIG. 6 is a flow chart of a first preferred embodiment of the invention.

Referring particularly to FIG. 6, the scan starts by acquiring blood flow navigator data using the above described pulse sequence as indicated at process block 150. This acquires a complete set of k-space data and the next step indicated at process block 152 is to reconstruct a navigator image from this navigator k-space data set. This includes a 2D Fourier transformation of the complex k-space data and phase correction of alternate lines in the resulting image based on the phase correction calculated from the three non-phase encoded lines of k-space, followed by the calculation of the phase φ at each image pixel. In the preferred embodiment the navigator data is velocity encoded and the navigator image is a phase image which indicates spin velocity at each image pixel. If the navigator data is not velocity encoded, the navigator image is a magnitude image in which each image pixel indicates the magnitude M of the acquired NMR signal.

As indicated at process block 154, the arterial blood velocity is then measured using information from the navigator data, an in particular, the navigator image. This step locates one or more arteries in the navigator image and calculates the average velocity of the pixels therein. In the velocity encoded navigator image, the arteries are located by thresholding the velocity encoded image and detecting an isolated group of voxels in which the peak velocity exceeds 100 mm/s (expected carotid blood flow velocity is approximately 200 mm/s). In addition or alternatively, the carotid arteries may be detected by calculating a spectrum for each pixel in the velocity image with respect to time (i.e. over for example 10 s of blood flow navigator data, collected additionally during a prescan at the beginning of the acquisition). The relevant pixels are those with substantial fundamental frequency content between 0.6 and 2.5 Hz, corresponding to a heart rate of between 36 and 150 bpm. If a non-velocity encoded navigator image is employed, the arteries are located manually during a prescan and the average magnitude value of the pixels therein are calculated to measure an indication of blood flow velocity. The arteries may also be identified automatically using the spectral method described above, although this method is less reliable without velocity encoding.

As indicated at decision block 156, the next step is to determine if a gating signal should be produced. This can be done in a number of different ways, but in the preferred embodiment a threshold value is preset and when this preset threshold level is reached by the measured blood velocity value, a timer is started. The timer is also a preset interval and when it expires, a gating signal is produced that directs the MRI system to acquire the prescribed fMRI data as indicated at process block 158. The threshold value is typically preset to detect the blood surge corresponding to the ECG signal R wave, and the timer is set to start fMRI data acquisition during the subsequent R-R interval.

If the gating signal is not produced as determined at decision block 156, the system loops back to acquire another blood flow navigator image and determine again if the gating signal is to be produced. However, the polarity of the velocity encoding gradient ($G_M$ 120 in FIG. 5) is first inverted as indicated at process block 160. As is well known in the art this is accomplished by switching the polarity of the lobes on the $G_M$ gradient waveform 120. As a result, the first moment $M_1$ of this velocity encoding gradient 120 is alternated in polarity as the blood flow navigator data sets are sequentially acquired during the scan. Rather than relying on the phase of a single blood flow navigator image to accurately indicate blood flow velocity, the difference between two successive navigator phase images is calculated. This subtraction of two successive images not only nulls phase shifts caused by sources other than moving spins, but it also increases the SNR of the blood velocity image.

Referring still to FIG. 6, after each gating signal is produced a prescribed amount of fMRI data is acquired at process block 158. The amount of fMRI data acquired in response to each gating signal depends on circumstances such as the subject's heart rate and the particular fMRI study being conducted. With the 2D EPI pulse sequence described above, typically one or two slices of data are acquired from the slab 100 during each R-R interval. If a 3D EPI pulse sequence is used, a corresponding segment of k-space data is acquired during each R-R interval. It is contemplated that by using parallel acquisition methods such as SENSE and SMASH with multi-element head coils, that the entire slab 100 may be acquired during a single R-R interval.

An fMRI scan requires the acquisition of a series of image frames as discussed above, and the gating of fMRI acquisitions continues until the end of the scan is reached as determined at decision block 162. As indicated at process block 164, the 2D images 300 are reconstructed to form the 3D array 301 of time course study data as described above and shown in FIG. 3. Because all the fMRI data in the time course study was acquired at substantially the same moment during each heart beat, the tissue motion caused by pulsatile blood flow is prospectively eliminated from the process.

In the above embodiment the blood flow navigator image is used to prospectively gate the acquisition of fMRI data. While this method avoids the acquisition of fMRI data that is corrupted by motion due to pulsatile blood flow, it also increases the total scan time and/or time resolution of the acquired time course data set 301.

Figure 7:
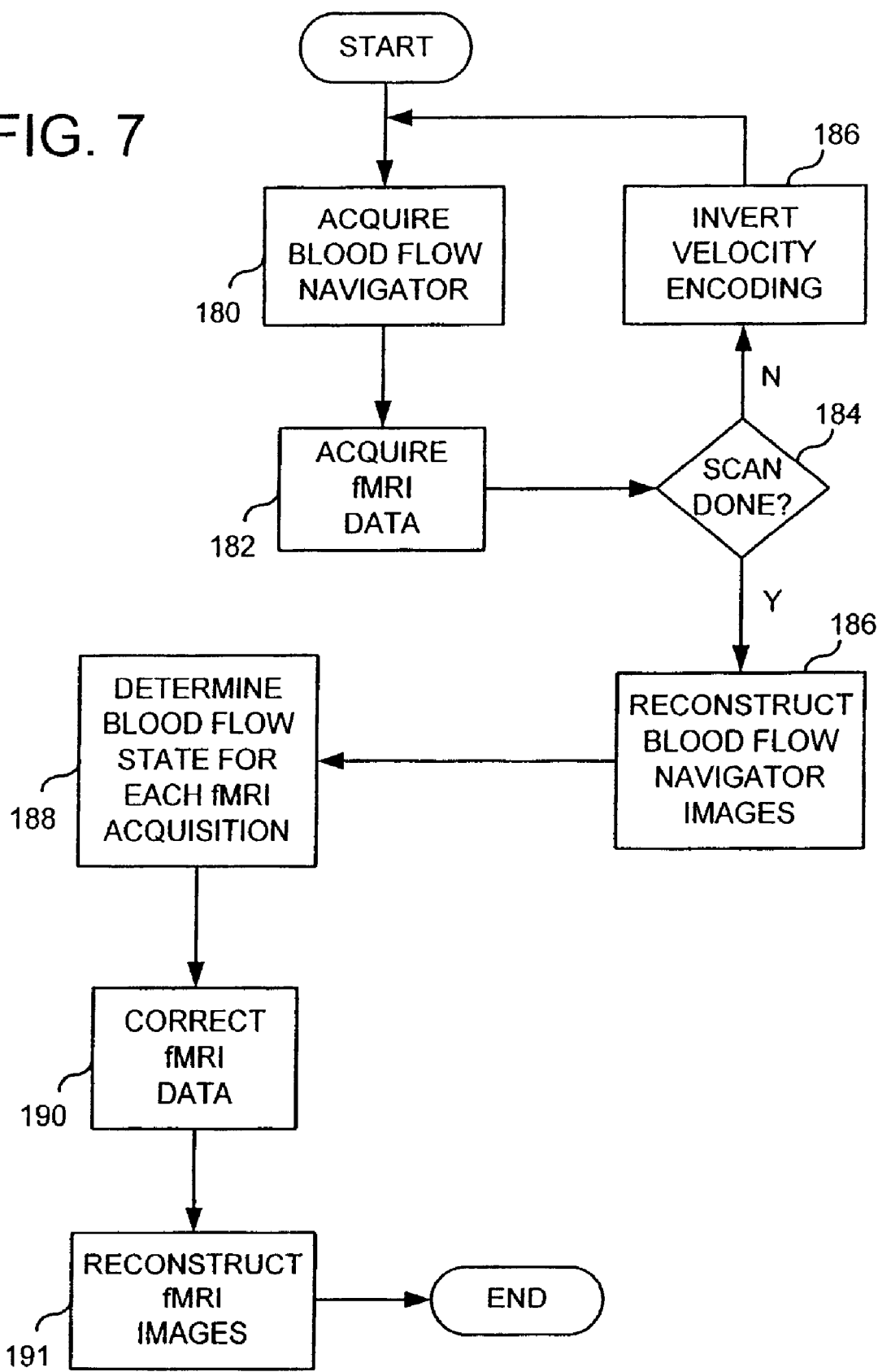
FIG. 7 is a flow chart of a second preferred embodiment of the invention.

Another way to use the blood flow navigator image is to correct the fMRI data after it is acquired. Referring particularly to FIG. 7, with this retrospective method the acquisition of the blood flow navigator data indicated at process block 180 is interleaved with the acquisition of fMRI data indicated at process block 182. A loop is established in which navigator data is alternately acquired with fMRI data until the fMRI study is completed as determined at decision block 184. As with the prospective gating method described above, the velocity encoding gradient $G_M$ 120 is inverted in polarity after each navigator image acquisition as indicated at process block 186. As explained above, this enables a more accurate measurement of blood flow velocity to be made.

After the fMRI study is completed, processing of the acquired data begins with a reconstruction of all the acquired blood flow navigator images as indicated at process block 186. As described above, this includes a 2DFT image reconstruction followed by either a phase or magnitude calculation at each image pixel depending on whether or not a velocity encoding gradient is used in the blood flow navigator pulse sequence.

For each set of acquired fMRI data there is a corresponding blood flow navigator image that indicates the state of vascular blood flow at the time the fMRI data was acquired. As indicated at process block 188, this blood flow state is determined from each blood flow navigator image by examining the average velocity of blood flow in one or more arteries. The objective is to obtain a signal that is equivalent to an ECG or pulse oximeter signal which correlates with blood flow in the tissues being imaged.

As indicated at process block 190, blood flow state information is then used to correct the fMRI data acquired with the blood flow navigator image. Retrospective correction is done using a method such as RETROICOR described by Glover, Li and Ress, Mag Res Med 44:162-167, 2000. In this method, the noise in the fMRI time series y(t) recorded at each pixel is assumed to be additive and expressed as $y_\delta(t)$. The noise term $y_\delta(t)$ is then given by the Fourier series expansion $$y_\delta(t) = \sum_{m=1}^{M} a_m \cos[m\varphi(t)] + b_m \sin[m\varphi(t)]$$

where φ(t) is the cardiac phase defined as $$\phi(t) = 2\pi(t-t_1)/(t_2-t_1)$$

and t is the acquisition time for the pixel being corrected, $t_1$ is the last R wave and t2 is the next R wave. When the blood flow navigator image is used, the peak flow velocity in each cycle is used as the reference for $t_1$ and $t_2$ instead of the R wave. The RETROICOR method requires a signal that is synchronized with the cardiac cycle. Whether this is obtained from the ECG, pulse oximeter signal or blood flow navigator signal is irrelevant to the correction algorithm. The coefficients a and b are given separately for each pixel by the expressions $$a_m = \sum_{n=1}^{N} [y(t_n) - \bar{y}]\cos(m\varphi(t_n)) \bigg/ \sum_{n=1}^{N} \cos^2(m\varphi(t_n))$$

and $$b_m = \sum_{n=1}^{N} [y(t_n) - \bar{y}]\sin(m\varphi(t_n)) \bigg/ \sum_{n=1}^{N} \sin^2(m\varphi(t_n)).$$

A value for M of 2 was found by Glover et al. to be sufficient to model the cardiac noise. The corrected signal for each pixel is determined by subtracting the estimated noise $y_\delta(t)$ from the measured signal y(t).

As indicated at process block 191, the corrected fMRI data is used to reconstruct images 300 to produce the time course data set 301 illustrated in FIG. 3. This is a conventional 2DFT reconstruction as described above.

There are many possible variations from the preferred embodiments described above. The blood flow navigator pulse sequence need not be EPI-based and it can be used in other clinical settings with other imaging pulse sequences. For example, it may be used in combination with 2D or 3D gradient-recalled echo pulse sequences to acquire NMR data from other organs or vasculature which is moved by pulsatile blood flow. Regardless of the clinical application, the flip angle of the RF excitation pulse 110 in the magnetization maintenance segment of the blood flow navigator pulse sequence should be selected to maintain a steady-state spin magnetization in the imaging volume.

The invention claimed is:

1. A method for acquiring MRI data with a magnetic resonance imaging (MRI) system from tissues supplied by pulsatile blood flow through an artery, the steps comprising:
    a) performing a blood flow navigator pulse sequence with the MRI system to acquire navigator data from said artery that indicates blood flow, the navigator pulse sequence including a magnetization maintenance sequence that produces an RF excitation pulse having a flip-angle selected to maintain a steady-state spin magnetization in said tissues;
    b) acquiring tissue data from said tissues using the MRI system; and
    c) using information in the navigator data acquired with the blood flow navigator pulse sequence to reduce the effect of pulsatile blood flow on an image of the tissues reconstructed with the tissue data acquired in step b).

2. The method as recited in claim 1 in which step c) includes using the navigator data acquired in step a) to produce a gating signal, and using the gating signal to initiate the acquisition of the tissue data in step b).

3. The method as recited in claim 1 in which step c) includes using the navigator data acquired in step a) to calculate corrections; and correcting the tissue data acquired in step b) using the calculated corrections.

4. The method as recited in claim 1 in which the tissues are located in the brain of a subject and the artery is located in the neck of the subject.

5. The method as recited in claim 4 in which steps a) and b) are repeated a plurality of times to form a plurality of images from the tissue data.

6. The method as recited in claim 5 in which the plurality of images form a time course fMRI study.

7. The method as recited in claim 1 in which the blood flow navigator pulse sequence also includes a velocity encoding gradient pulse, and step c) further includes reconstructing a phase image from the navigator data acquired in step a).

8. The method as recited in claim 7 in which the blood flow navigator pulse sequence acquires the navigator data using an echo planar image (EPI) pulse sequence.

9. The method as recited in claim 8 in which the tissue data is acquired in step b) using an EPI pulse sequence.

10. The method as recited in claim 9 in which the EPI pulse sequence employed in step b) is a two dimensional EPI pulse sequence that acquires image data from a slice of said tissues, and the two-dimensional EPI pulse sequence is performed a plurality of times.

11. The method as recited in claim 1 in which the RF excitation pulse in the magnetization maintenance sequence is spatially selective and the magnetization maintenance sequence includes:

producing a slab select gradient that operates in combination with the spatially selective RF excitation pulse to excite spins in a slab that includes the tissues.

12. The method as recited in claim 11 in which the magnetization maintenance sequence also includes:

producing a spoiler gradient that substantially dephases transverse spin magnetization produced in said slab by said RF excitation pulse.

* * * * *